(12) United States Patent
Bayram et al.

(10) Patent No.: US 9,059,075 B2
(45) Date of Patent: Jun. 16, 2015

(54) SELECTIVE GALLIUM NITRIDE REGROWTH ON (100) SILICON

(71) Applicant: International Business Machines Corporation, Armonk, NY (US)

(72) Inventors: Can Bayram, Ossining, NY (US); Cheng-Wei Cheng, White Plains, NY (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/751,799

(22) Filed: Jan. 28, 2013

(65) Prior Publication Data
US 2014/0131724 A1  May 15, 2014

Related U.S. Application Data

(63) Continuation of application No. 13/677,997, filed on Nov. 15, 2012.

(51) Int. Cl.
*H01L 21/00* (2006.01)
*H01L 29/20* (2006.01)
(Continued)

(52) U.S. Cl.
CPC ...... *H01L 29/2003* (2013.01); *H01L 21/02381* (2013.01); *H01L 21/0243* (2013.01); *H01L 21/02433* (2013.01); *H01L 21/02458* (2013.01); *H01L 21/0254* (2013.01); *H01L 21/0262* (2013.01); *H01L 21/02639* (2013.01); *H01L 21/02647* (2013.01); *H01L 21/02658* (2013.01);
(Continued)

(58) Field of Classification Search
None
See application file for complete search history.

(56) References Cited

U.S. PATENT DOCUMENTS

| 4,865,830 A | 9/1989 | Klabunde et al. |
| 6,183,555 B1 | 2/2001 | Shibata et al. |

(Continued)

FOREIGN PATENT DOCUMENTS

FR  2908925  5/2008

OTHER PUBLICATIONS

Chung, J. W, et al., "On-Wafer Seamless Integration of GaN and Si (100) Electronics", Compound Semiconductor Integrated Circuit Symposium, 2009. CISC 2009. Annual IEEE, Oct. 11-14, 2009.
(Continued)

*Primary Examiner* — Charles Garber
*Assistant Examiner* — Evren Seven
(74) *Attorney, Agent, or Firm* — Scully, Scott, Murphy & Presser, P.C.; Louis J. Percello, Esq.

(57) ABSTRACT

A method for selective formation of a gallium nitride material on a (100) silicon substrate. The method includes forming a blanket layer of dielectric material on a surface of a (100) silicon substrate. The blanket layer of dielectric material is then patterned forming a plurality of patterned dielectric material structures on silicon substrate. An etch is employed that selectively removes exposed portions of the silicon substrate. The etch forms openings within the silicon substrate that expose a surface of the silicon substrate having a (111) crystal plane. A contiguous AlN buffer layer is then formed on exposed surfaces of each patterned dielectric material structure and on exposed surfaces of the silicon substrate. A gallium nitride material is then formed on a portion of the contiguous AlN buffer layer and surrounding each sidewall of each patterned dielectric material structure.

14 Claims, 9 Drawing Sheets

(51) Int. Cl.
*H01L 21/02* (2006.01)
*H01L 29/04* (2006.01)
*H01L 33/00* (2010.01)
*H01L 33/12* (2010.01)

(52) U.S. Cl.
CPC .............. *H01L 29/04* (2013.01); *H01L 29/045* (2013.01); *H01L 33/007* (2013.01); *H01L 33/12* (2013.01)

(56) References Cited

U.S. PATENT DOCUMENTS

| | | | |
|---|---|---|---|
| 6,242,764 | B1 | 6/2001 | Ohba et al. |
| 7,420,226 | B2 | 9/2008 | Augustine et al. |
| 7,785,991 | B2 | 8/2010 | Joblot et al. |
| 7,947,576 | B2 | 5/2011 | Iagari et al. |
| 7,968,913 | B2 | 6/2011 | Hopper et al. |
| 8,129,205 | B2 | 3/2012 | Rana et al. |
| 8,183,667 | B2 | 5/2012 | Park |
| 8,278,125 | B2 | 10/2012 | Chen et al. |
| 2002/0155712 | A1 | 10/2002 | Urashima et al. |
| 2003/0136333 | A1 | 7/2003 | Semond et al. |
| 2003/0201513 | A1* | 10/2003 | Regan et al. ............... 257/521 |
| 2006/0289876 | A1 | 12/2006 | Briere |
| 2008/0023710 | A1 | 1/2008 | Park et al. |
| 2008/0149936 | A1 | 6/2008 | Joblot et al. |
| 2008/0245767 | A1 | 10/2008 | Kim et al. |
| 2009/0008647 | A1 | 1/2009 | Li et al. |
| 2009/0026473 | A1 | 1/2009 | Jiang et al. |
| 2009/0149008 | A1 | 6/2009 | Kryliouk et al. |
| 2010/0025730 | A1 | 2/2010 | Heikman et al. |
| 2010/0032696 | A1 | 2/2010 | Yu et al. |
| 2010/0140663 | A1* | 6/2010 | Hopper et al. ............... 257/194 |
| 2011/0012169 | A1* | 1/2011 | Takizawa et al. ............ 257/103 |
| 2011/0049568 | A1* | 3/2011 | Lochtefeld et al. .......... 257/190 |
| 2011/0049681 | A1 | 3/2011 | Vielemeyer |
| 2011/0108594 | A1 | 5/2011 | Davis |
| 2011/0108850 | A1 | 5/2011 | Cheng et al. |
| 2011/0180806 | A1 | 7/2011 | Hebert |
| 2011/0180857 | A1 | 7/2011 | Hoke et al. |
| 2011/0260210 | A1 | 10/2011 | Su |
| 2012/0003770 | A1 | 1/2012 | Hashimoto et al. |
| 2012/0205617 | A1 | 8/2012 | Pan et al. |
| 2012/0211759 | A1 | 8/2012 | Liu et al. |
| 2012/0270378 | A1 | 10/2012 | Kittler et al. |
| 2012/0288995 | A1* | 11/2012 | El-Ghoroury et al. ....... 438/107 |
| 2012/0305992 | A1* | 12/2012 | Marino et al. ............... 257/200 |
| 2013/0271208 | A1* | 10/2013 | Then et al. ................... 327/541 |

OTHER PUBLICATIONS

Wan, J., et al., "Growth of GaN on a nanoscale-faceted Si substrate by metal-organic vapor-phase epitaxy", Applied Physics Letters, Sep. 3, 2001, vol. 79, No. 10.

Song, J.H., et al., "Nonpolar a-plane GaN film on Si(100) produced using a specially designed lattice-matched buffer: A fresh approach to eliminate the polarization effect", Journal of Applied Physics, Feb. 2005, 97, 043531.

Lee, S.C., et al., "Growth of crack-free hexagonal GaN films on Si(100)", Physics, Applied Physics Letters, Sep. 2001 Volume: 79, Issue 10, pp. 1459-1461.

International Search Report and Written Opinion dated Jan. 24, 2014 from related International Application No. PCT/US 13/59120.

U.S. Office Action dated Feb. 20, 2015 received in U.S. Appl. No. 13/677,997.

* cited by examiner

SELECTIVE GALLIUM NITRIDE REGROWTH ON (100) SILICON

CROSS REFERENCE TO RELATED APPLICATION

This application is a continuation of U.S. patent application Ser. No. 13/677,997, filed Nov. 15, 2012, the entire content and disclosure of which is incorporated herein by reference.

BACKGROUND

The present disclosure generally relates to a method for integrating Group III nitrides (e.g. GaAlInN) with silicon and more particularly to a method of selectively forming a gallium nitride material on a (100) silicon substrate. The present disclosure also relates to a semiconductor structure including a gallium nitride material surrounding sidewalls of a patterned dielectric material structure and located adjacent a surface of the (100) silicon substrate having a (111) crystal plane.

Group III nitride materials are a unique group of semiconductor materials which can be used in a wide variety of applications including, for example, optoelectronics, photovoltaics and lighting. Group III nitride materials are composed of nitrogen and at least one element from Group III, i.e., aluminum (Al), gallium (Ga) and indium (In), of the Periodic Table of Elements. Illustrative examples of some common gallium nitrides are GaN, GaAlN, and GaAlInN. By changing the composition of Al, Ga and/or In within a Group III nitride material, the Group III nitride material can be tuned along the electromagnetic spectrum; mainly from 210 nm to 1770 nm. This spectrum includes the visible light emitting diode (LED), which is more than a 10 billion dollar industry with a forecasted double digit yearly growth rate. This continuous growth in LED demand enables the infrastructural build-up for the growth and fabrication of Group III nitride based semiconductor devices.

One of the bottlenecks for Group III nitride based semiconductor devices is a lack of a latticed matched substrate. Some of the conventional substrates are sapphire ($Al_2O_3$), silicon carbide (SiC), silicon (Si), and zinc oxide (ZnO) that have about 13%, 3%, 17% and 2%, respectively, lattice mismatch with GaN. Currently, lattice matched freestanding GaN and AlN substrates are being developed. However, lattice matched substrates suffer from availability and cost.

Most of the Group III nitride consumer-targeted devices are conventionally grown on sapphire substrates. There is, however, a need for the development of Group III nitride technology on more available and cheaper substrates such as silicon. The integration between Group III nitrides and silicon substrates are difficult because of the different crystal structure and lattice constant of those materials. As such, a method is needed which can be used to easily integrate Group III nitride materials with silicon substrates.

SUMMARY

In one aspect of the present disclosure, a method for selectively forming a gallium nitride material on a silicon substrate is provided. The method of the present disclosure includes first forming a blanket layer of dielectric material on an uppermost surface of a (100) silicon substrate. Next, the blanket layer of dielectric material is patterned forming a plurality of patterned dielectric material structures on portions of the uppermost surface of the (100) silicon substrate and exposing other portions of the uppermost surface of the (100) silicon substrate. The exposed other portions of the uppermost surface of the (100) silicon substrate are then etched to expose a surface within the (100) silicon substrate having a (111) crystal plane. A contiguous AlN buffer layer is then formed on exposed surfaces of each patterned dielectric material structure and on exposed surfaces of the silicon substrate. A gallium nitride material is then formed on a portion of the contiguous AlN buffer layer and surrounding each sidewall of each patterned dielectric material structure.

In another aspect of the present disclosure, a semiconductor structure is provided. The semiconductor structure of the present disclosure includes a (100) silicon substrate having a plurality of patterned dielectric material structures located on an uppermost surface of the silicon substrate and a plurality of openings located within the silicon substrate and beneath the plurality of patterned dielectric material structures, wherein each opening exposes a surface of the silicon substrate having a (111) crystal plane. The structure of the present disclosure further includes a gallium nitride material surrounding each sidewall of each patterned dielectric material structure and located adjacent to the surface of the silicon substrate having the (111) crystal plane. A semiconductor device can be positioned upon and within the gallium nitride material.

In a further aspect of the present disclosure, a semiconductor structure is provided that includes a (100) silicon substrate having a plurality openings located within the silicon substrate, wherein each opening exposes a surface of the silicon substrate having a (111) crystal plane. This structure further includes an epitaxial semiconductor material located on an uppermost surface of the (100) silicon substrate, and a gallium nitride material located adjacent to the surface of the silicon substrate having the (111) crystal plane and adjacent a portion of the epitaxial semiconductor material. The structure also includes at least one semiconductor device located upon and within the gallium nitride material and at least one other semiconductor device located upon and within the epitaxial semiconductor material.

DETAILED DESCRIPTION

The present disclosure, which provides a method of selectively forming a gallium nitride material on a (100) silicon substrate, and a semiconductor structure including a gallium nitride material surrounding sidewalls of a patterned dielectric material structure and present on a (111) crystal plane of a (100) silicon substrate, will now be described in greater detail by referring to the following discussion and drawings that accompany the present disclosure. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Metalorganic chemical vapor deposition (MOCVD) has been the backbone of the Group III-nitrides growth and an industry standard for epitaxial growth of compound semiconductors on a crystalline substrate. There has been a sustained improvement in wafer throughput by MOCVD making it cost-effective in mass-production. For GaN-based transistors to be competitive: epitaxial process and substrate cost must be <$2/cm$^2$ as well as current power device material demand (>10$^7$ 6-inch wafers per year) must be fulfilled through mature process platform.

MOCVD technology is the most mature and scalable to volume production. All commercial electronics have so far been produced with MOCVD systems (especially LED). Silicon substrates are the most scalable and cost effective for volume production. Adequate epitaxial film uniformity, defect levels, device reliability and process cost structure must be achieved to permit the use of gallium nitride (GaN) on Si based devices to achieve widespread use in power electronics. Device processing should be CMOS compatible to achieve commercially viability. Thus, there is a need for the integration of GaN devices on silicon substrates that benefits the MOCVD growth capabilities. Particularly, silicon (100) is of interest due to integration of GaN-based devices with CMOS technology.

Currently, for the MOCVD growth of GaN onto silicon substrates, silicon (111) substrates are employed. Si (111) is preferred for GaN epitaxy due to the three fold symmetry of Si 111 plane and hexagonal structure (six-fold symmetry) of GaN. Si (100) is another substrate of interest due to possible integration of GaN devices with Si (i.e., CMOS) electronics. However, GaN on Si (001) leads to polycrystalline structures or very rough surfaces consisting of many grains. The reason for this is the fourfold symmetry and the possibility for GaN with its sixfold symmetry to grow with two preferred rotational alignments on this surface. For such c-axis oriented material, the lattice mismatch is anisotropic and yields approximately 15% for <112bar0>||Si<1bar00> and 0.7% for <101bar0>||Si<1bar00>. While these mismatch values are lower than for Si (111), the material quality is low due to twist boundaries. Thus, off cut-oriented Si (100) substrates (typically 4° to 7° towards (110)) are preferred for single crystalline GaN epitaxy. However, for true integration with silicon electronics, it is essential to develop GaN epitaxy on non-off cut Si (100) substrates as off cut substrates lead to anisotropy and performance issue in silicon electronic devices.

Although the lattice mismatch between (0001) GaN and (111) Si is −16.8%, the main bottleneck for GaN-on-Silicon epitaxy is the thermal lattice mismatch (approximately −53%) that leads to cracking. The present disclosure provides a method to reconcile the issue of lattice and thermal mismatch of the direct epitaxy growth and thus allow for facile integration of a gallium nitride material and a (100) silicon material. The term "gallium nitride material" as used throughout the present disclosure denotes pure gallium nitride, or gallium nitride that may include other Group III elements such as, for example, Al and/or In. As such, the term "gallium nitride material" as used throughout the present disclosure includes gallium nitride-containing materials such as, for example, GaN, GaAlN, GaInN and GaAlInN.

The method of the present disclosure includes forming a blanket layer of dielectric material on a surface of a (100) silicon substrate. The blanket layer of dielectric material is then patterned forming a plurality of patterned dielectric material structures on the silicon substrate. An etch is employed that selectively removes exposed portions of the silicon substrate. The etch forms openings within the silicon substrate that expose a surface of the silicon substrate having a (111) crystal plane. A contiguous AlN buffer layer is then formed on exposed surfaces of each patterned dielectric material structure and on exposed surfaces of the silicon substrate. A gallium nitride material is then formed on a portion of the contiguous AlN buffer layer and surrounding each sidewall of each patterned dielectric material structure. This method will now be described in greater detail by referring to FIGS. 1-6.

Figure 1:
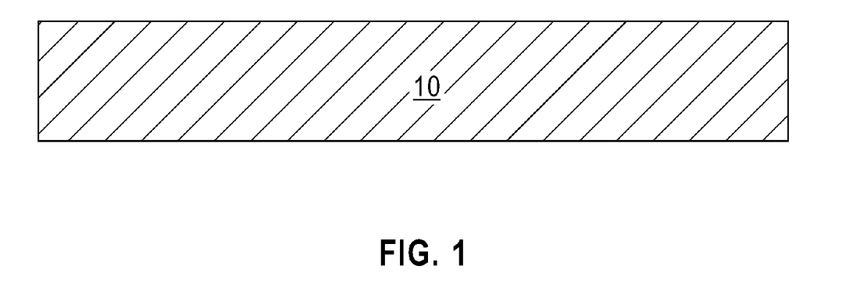
FIG. 1 is a pictorial representation (through a cross sectional view) illustrating a (100) silicon substrate that can be employed in one embodiment of the present disclosure.

Referring first to FIG. 1, there is illustrated a silicon substrate 10 which has a (100) crystallographic surface orientation that can be employed in one embodiment of the present disclosure. The silicon substrate 10 having the (100) crystallographic surface orientation may also be referred to herein as "a (100) silicon substrate". In one embodiment, and as illustrated in the drawings, the (100) silicon substrate 10 may be a bulk semiconductor material having silicon located between a planar uppermost surface and a planar bottommost surface. In another embodiment, the (100) silicon substrate 10 may be a topmost layer of a silicon-on-insulator substrate. In such an embodiment, an insulator material such as, for example, a dielectric material, can be located between the planar uppermost surface and a planar bottommost surface of the silicon-on-insulator substrate, and the (100) silicon substrate 10 is located on an uppermost surface of the insulator material. A semiconductor material such as, for example, silicon, germanium, silicon germanium, a III-V compound semiconductor material or a II-V semiconductor material can be located beneath the insulator material of the silicon-on-insulator substrate. In yet another embodiment, the (100) silicon substrate 10 can be a topmost layer of a multilayered stack of semiconductor materials. In still yet another embodiment, the (100) silicon substrate can be a topmost layer of a silicon-on-sapphire substrate.

The (100) silicon substrate 10 that can be employed in the present disclosure is typically a single crystalline material and may be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The (100) silicon substrate 10 may contain one region that is doped with a p-type dopant and other region that is doped with an n-type dopant. The thickness of the (100) silicon substrate 10 can be from 50 microns to 2 cm, although lesser and greater thickness can also be employed.

Figure 2:
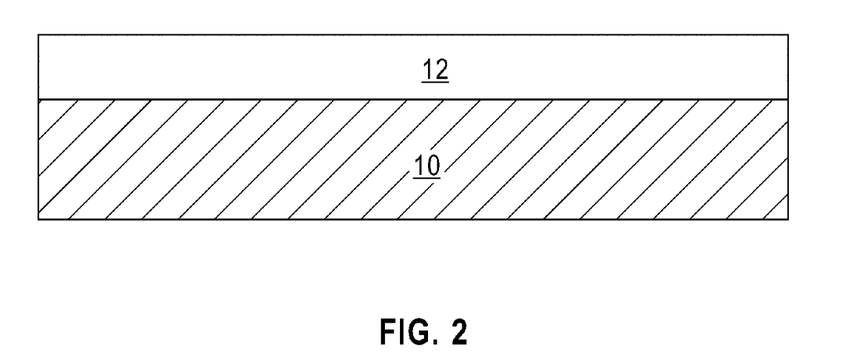
FIG. 2 is a pictorial representation (through a cross sectional view) illustrating the silicon substrate illustrated in FIG. 1 after forming a blanket layer of dielectric material on an uppermost surface of the silicon substrate.

Referring now to FIG. 2, there is illustrated the (100) silicon substrate 10 of FIG. 1 after forming a blanket layer of dielectric material 12 on an uppermost surface of the (100) silicon substrate 10. As shown, the blanket layer of dielectric material 12 is a contiguous layer that covers the entire uppermost surface of the (100) silicon substrate 10. In some embodiments, the blanket layer of dielectric material 12 can be comprised of silicon dioxide, silicon nitride, or silicon oxynitride.

In one embodiment of the present disclosure, the blanket layer of dielectric material 12 can be formed using a thermal process including, for example, thermal oxidation, thermal nitridation and thermal oxynitridation. In such an embodiment, the (100) silicon substrate 10 is heated in an oxidizing and/or nitriding ambient at a temperature of 700° C. or greater. In another embodiment of the present disclosure, the blanket layer of dielectric material 12 can be formed onto the uppermost surface of the (100) silicon substrate 10 by utilizing a deposition process such as, for example, chemical vapor deposition, and plasma enhanced chemical vapor deposition. Notwithstanding which technique is used in forming the blanket layer of dielectric material 12, the blanket layer of dielectric material 12 typically has a thickness a few monolayers to as thick as a couple of microns or more.

Figure 3:
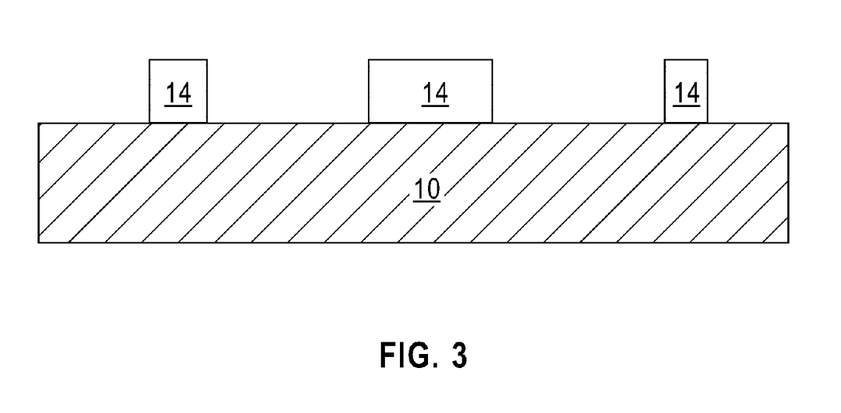
FIG. 3 is a pictorial representation (through a cross sectional view) illustrating the structure of FIG. 2 after forming patterned dielectric material structures from the blanket layer of dielectric material.

Referring to FIG. 3, there is illustrated the structure of FIG. 2 after forming a plurality of patterned dielectric material structures (hereinafter patterned dielectric material structures 14) from the blanket layer of dielectric material 12. As shown, the patterned dielectric material structures 14 are located on portions of the uppermost surface of the (100) silicon substrate 10, while other portions of the (100) silicon substrate are exposed.

The patterned dielectric material structures 14 can be formed by lithography and etching. The lithographic step used in forming the patterned dielectric material structures 14 includes applying a blanket layer of a photoresist material on the uppermost surface of the blanket layer of dielectric material, exposing the photoresist material to radiation and developing the exposed photoresist material. The etching step used in forming the patterned dielectric material structures 14 may include a dry etching process or a chemical wet etching process. When a dry etching process is employed, one of reactive ion etching, plasma etching, and ion beam etching can be used. When a chemical wet etch process is employed, a chemical etchant that selectively removes exposed portions of the blanket layer of dielectric material is used. After the etching process has been performed, the patterned photoresist material is stripped from the structure utilizing a conventional resist stripping process such as, for example, ashing.

Each patterned dielectric material structure 14 that is formed has four sides, i.e., four vertical sidewalls, and thus is in the shape of a parallelogram. In one embodiment, each patterned dielectric material structure 14 is a square. In another embodiment, each patterned dielectric material structure 14 is a rectangle.

Each patterned dielectric material structure 14 has a length and width. In some embodiments, the length can equal the width. In other embodiments, the length can be different (greater than or less than) from the width. The length of each patterned dielectric material structure 14 can be within a range from 10 nm to 100 μm, while the width can be from 10 nm to 100 μm. Other width and length values are possible with the upper limit being application dependent. In the present application, the width of each patterned dielectric material structure 14 runs parallel to the cross section shown in FIG. 3, while the length of each patterned dielectric material structure 14 runs into and out of the cross section shown in FIG. 3.

Figure 4:
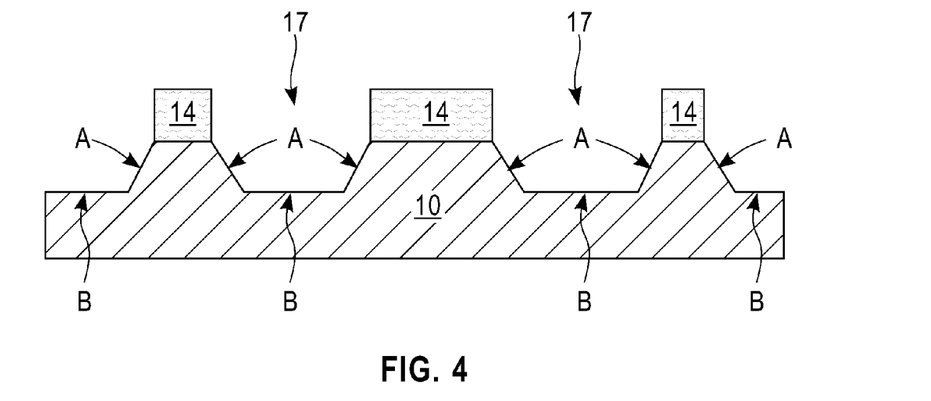
FIG. 4 is a pictorial representation (through a cross sectional view) illustrating the structure of FIG. 3 after etching exposed surfaces of the silicon substrate to form openings in the silicon substrate that expose a surface of the silicon substrate having a (111) crystal plane.

Referring now to FIG. 4, there is illustrated the structure of FIG. 3 after etching exposed surfaces of the (100) silicon substrate 10 using each patterned dielectric material structures 14 as an etch mask to form openings 17 in the (100) silicon substrate 10 that expose a surface (designated as "A" in FIG. 4) of the (100) silicon substrate 10 within each opening 17 that has a (111) crystal plane. By "(111) crystal plane" it is meant any plane within the (111) crystal plane family including, but not limited to, 111, 1bar11, and 11bar1. In the drawing, the designation "B" denotes a planar surface of the (100) silicon substrate 10 that has a (100) crystal plane which is located beneath the uppermost surface of the (100) silicon substrate 10. By "(100) crystal plane" it is meant any plane within the (100) crystal plane family.

The etching of the exposed surfaces of the (100) silicon substrate can be performed utilizing a crystallographic wet etch; the crystallographic wet etch may also be referred to as an anisotropic wet etch that is orientation dependent. In one embodiment of the present disclosure, the crystallographic wet etch that is employed includes using KOH as a chemical etchant. Other chemical etchants can be used in the crystallographic wet etch as long as the chemical etchant that is selected is capable of exposing a surface of the (100) silicon substrate 10 having the (111) crystal plane. Examples of other chemical etchants that can be used in the crystallographic wet etch of the present disclosure, include, but are not limited to, an aqueous solution of ethylene diamine and pyrocatechol or tetramethylammonium hydroxide.

In accordance with an aspect of the present disclosure, each opening 17 that is formed within the (100) silicon substrate 10 has an upper portion having a width (w1) that is larger than a width (w2) of a lower portion. In some embodiments of the present disclosure, the width (w1) of the upper portion of each opening 17 is from 250 nm to 10,000 μm, while the width (w2) of the lower portion of each opening 17 is from 200 nm to 10,000 μm. In some embodiments, an upper portion of each opening 17 can extend beneath each of the patterned dielectric material structures 16.

The structure that is shown in FIG. 4 is then heated in a hydrogen atmosphere and then a prealuminization process is performed which stabilizes the surfaces of the silicon substrate. These steps are performed prior to forming the AlN buffer layer, and prior to forming the gallium nitride material. The heating of the structure shown in FIG. 4 in a hydrogen atmosphere includes placing the structure shown in FIG. 4 into a reactor chamber of a metalorganic chemical vapor deposition (MOCVD) apparatus. In some embodiments, and prior to placing the structure shown in FIG. 4 into the MOCVD reactor chamber, the structure can be cleaned using an HF cleaning process. The MOCVD reactor chamber including the structure shown in FIG. 4 is then evacuated to a pressure of about 50-100 mbar or less and then a hydrogen atmosphere is introduced into the reactor chamber. In some embodiments, the pressure within the MOCVD reactor is at atmospheric, i.e., 760 mbar. The hydrogen atmosphere may include pure hydrogen or hydrogen admixed with an inert carrier gas such as, for example, helium and/or argon. When an admixture is employed, hydrogen comprises at least 25% or greater of the admixture, the remainder of the admixture (up to 100%) is comprised of the inert carrier gas. With the hydrogen atmosphere present in the reactor chamber, the structure is heated to a temperature of about 900° C. or less. In one embodiment, the temperature in which the structure shown in FIG. 4 is heated under the hydrogen atmosphere is from 500° C. to 600° C. In another embodiment, the temperature in which the structure shown in FIG. 4 is heated under the hydrogen atmosphere is from 600° C. to 900° C. Notwithstanding the temperature in which the structure of FIG. 4 is heated under the hydrogen atmosphere, the heating is performed for a time period of 5 minutes to 20 minutes. This step of the present disclosure is believed to clean the surfaces and hydrogenate the exposed surfaces of the (100) silicon substrate. In some embodiments, the heating under hydrogen can be replaced with heating under an inert gas.

Since gallium will react directly with silicon, a prealuminization step is performed to stabilize the silicon nucleation sites prior to forming the gallium nitride material; no Al layer is formed during this step of the present disclosure. If the prealuminization step is not performed, gallium nitride material will not be selectively deposited around the patterned dielectric material structures. The prealuminization step is performed by introducing an organoaluminum precursor such as, for example, a trialkylaluminum compound, wherein the alkyl contains from 1 to 6 carbon atoms, into the reactor chamber. Examples of trialkylaluminum compounds that can be employed in the present disclosure, include, but are not limited to, trimethylaluminum, triethylaluminum, and tributylaluminum. The organoaluminum precursor can be introduced in the reactor chamber of the MOCVD apparatus neat, or it can be admixed with an inert carrier gas. The prealuminization step is typically performed at a temperature of 450° C. or greater. In one embodiment, the introducing of the organoaluminum precursor typically occurs at a temperature from 500° C. to 600° C. In another embodiment, the introduction of the organoaluminum precursor occurs at a temperature from 600° C. to 900° C. Notwithstanding the temperature in which the organoaluminum precursor is introduced into the reactor chamber, the prealuminization is performed for a time period of 5 seconds to 120 seconds.

After heating the structure shown in FIG. 4 in hydrogen and performing the above mentioned prealuminization step, a contiguous AlN buffer layer 18 is formed on exposed surfaces of each patterned dielectric material structure 14 and on exposed surfaces (A,B) of the (100) silicon substrate 10. The resultant structure including the contiguous AlN buffer layer 18 is shown, for example, in FIG. 5.

Figure 5:
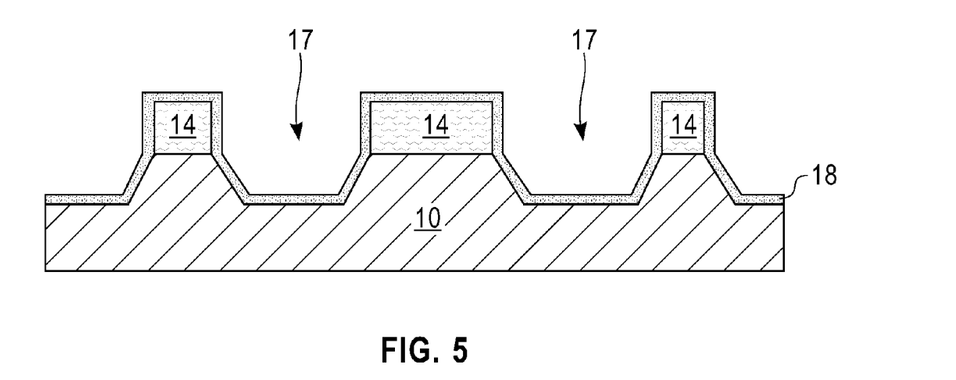
FIG. 5 is a pictorial representation (through a cross sectional view) of the structure of FIG. 4 after forming a contiguous AlN buffer layer on exposed surfaces of each patterned dielectric material structure and on exposed surfaces of the silicon substrate within each opening.

The contiguous AlN buffer layer 18 is formed by introducing an organoaluminum precursor (i.e., a trialkylaluminum compound as mentioned above) and a nitride precursor such as, for example, ammonium nitride into the reactor chamber of the MOCVD apparatus. An inert carrier gas may be present with one of the precursors used in forming the contiguous AlN buffer layer 18, or an inert carrier gas can be present with both the precursors used in forming the contiguous AlN buffer layer 18. The contiguous AlN buffer layer 18 is typically formed at a temperature of 600° C. or greater. In one embodiment, the deposition of the contiguous AlN buffer layer 18 typically occurs at a temperature from 650° C. to 850° C. In another embodiment, the deposition of the contiguous AlN buffer layer 18 typically occurs at a temperature from 850° C. to 1050° C. Notwithstanding the temperature in which the contiguous AlN buffer layer 18 is formed, the deposition of the contiguous AlN buffer layer 18 is performed for a time period of 1 minute to 20 minutes. The contiguous AlN buffer layer 18 that is formed typically has a thickness from 10 nm to 250 nm, with a thickness from 60 nm to 80 nm being even more typical. The Applicant of the present application has found that when the contiguous AlN buffer layer 18 is within the above described ranges, the selectivity of gallium nitride material deposition can be improved when a thicker AlN buffer layer is formed. For example, a 64 nm AlN buffer layer provides higher selectivity for gallium nitride material deposition as compared to a 32 nm AlN buffer layer. The 32 nm AlN buffer layer provides higher selectivity for gallium nitride material deposition as compared to a 10 nm AlN buffer layer.

Figure 6:
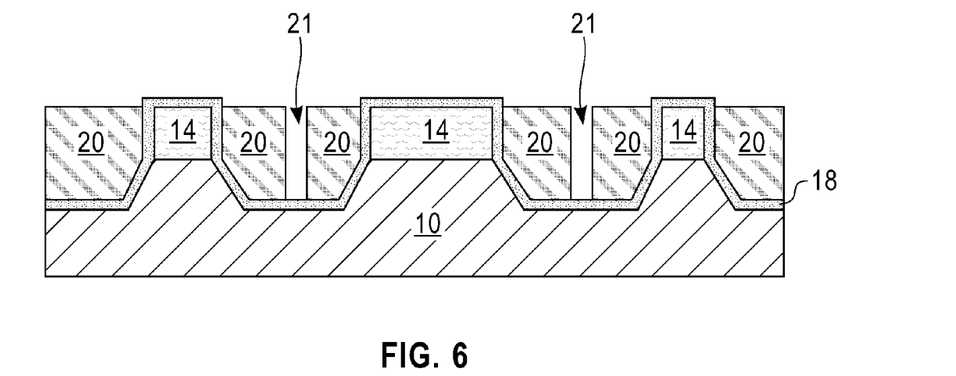
FIG. 6 is a pictorial representation (through a cross sectional view) illustrating the structure of FIG. 5 after forming a gallium nitride material on a portion of the contiguous AlN buffer layer and surrounding each sidewall of each patterned dielectric material structure.

Referring now to FIG. 6, there is illustrated the structure of FIG. 5 after selectively forming a gallium nitride material 20 surrounding each sidewall of each patterned dielectric material structure 14 and located adjacent the surface (i.e., surface A) of the silicon substrate having the (111) crystal plane. In some embodiments, and as illustrated in FIG. 6, a bottommost surface of the gallium nitride material 20 may extend above the planar surface (designated previously as B) of the (100) silicon substrate 10 that has a (100) crystal plane.

The gallium nitride material 20 that is formed at this point of the present disclosure is a contiguous material layer. In one embodiment of the present disclosure, the gallium nitride material 20 located adjoining corners of each patterned dielectric material structure 14 has a first thickness and the gallium nitride material 20 located adjoining sidewalls of each patterned dielectric material structure 14 has a second thickness, wherein the second thickness is greater than the first thickness. This aspect of the present disclosure can also be seen more clearly within the SEMs shown in FIGS. 7B and 7C of the present disclosure.

In some embodiments of the present disclosure, and as illustrated in FIG. 6, a space 21 is present between the gallium nitride material 20 that is located around different patterned dielectric material structures 14. In other embodiments (not shown), no space is present between the gallium nitride material 20 that is surrounding different patterned dielectric material structures. In some embodiments, the gallium nitride material 20 may have an uppermost surface that is coplanar with the uppermost surface of each patterned dielectric material structure 14. In other embodiments the gallium nitride material 20 may have an uppermost surface that is vertically offset, either above or below, the uppermost surface of each patterned dielectric material structure 14.

In one embodiment of the present disclosure, the gallium nitride material 20 is pure gallium nitride. In another embodiment of the present disclosure, the gallium nitride material 20 comprises gallium nitride that includes at least one other Group III element such as, for example, Al and/or In. In such an embodiment, the gallium nitride material 20 may comprise GaAlN, GaInN or GaAlInN.

Notwithstanding the composition of the gallium nitride material 18, the gallium nitride material 18 is single crystal. Also, the gallium nitride material 18 that is formed is a single phase material. By "single phase material" it is meant wurtzite phase: c-direction of GaN is aligned with (111) direction of the original (100) silicon substrate.

The deposition of the gallium nitride material 20 includes introducing an organogallium precursor and a nitride precursor such as, for example, ammonium nitride into the reactor chamber of the MOCVD apparatus. In some embodiments, an optional organoaluminum precursor (such as described above) and/or an optional organoindium precursor (such as, for example, a trialkylindium compound, e.g., trimethylindium) can also be used. Examples of organogallium precursors that can be employed in the present disclosure include trialkylgallium compounds such as, for example, trimethylgallium and triethylgallium. An inert carrier gas may be present with one of the precursors used in forming the gallium nitride material 20, or an inert carrier gas can be present with both the precursors used in forming the gallium nitride material 20. The deposition of the gallium nitride material is typically performed at a temperature of 850° C. or greater. In one embodiment, the deposition of the gallium nitride material 20 typically occurs at a temperature from 900° C. to 1200° C. In another embodiment, the deposition of the gallium nitride material 20 typically occurs at a temperature from 1200° C. to 1400° C. Notwithstanding the temperature in which the gallium nitride material 20 is formed, the deposition of the gallium nitride material 20 is performed for a time period of 1 minute to 2 hours. The gallium nitride material 20 that is formed typically has a thickness from 100 nm to 5000 nm, with a thickness from 500 nm to 1000 nm being even more typical.

Figure 7A:
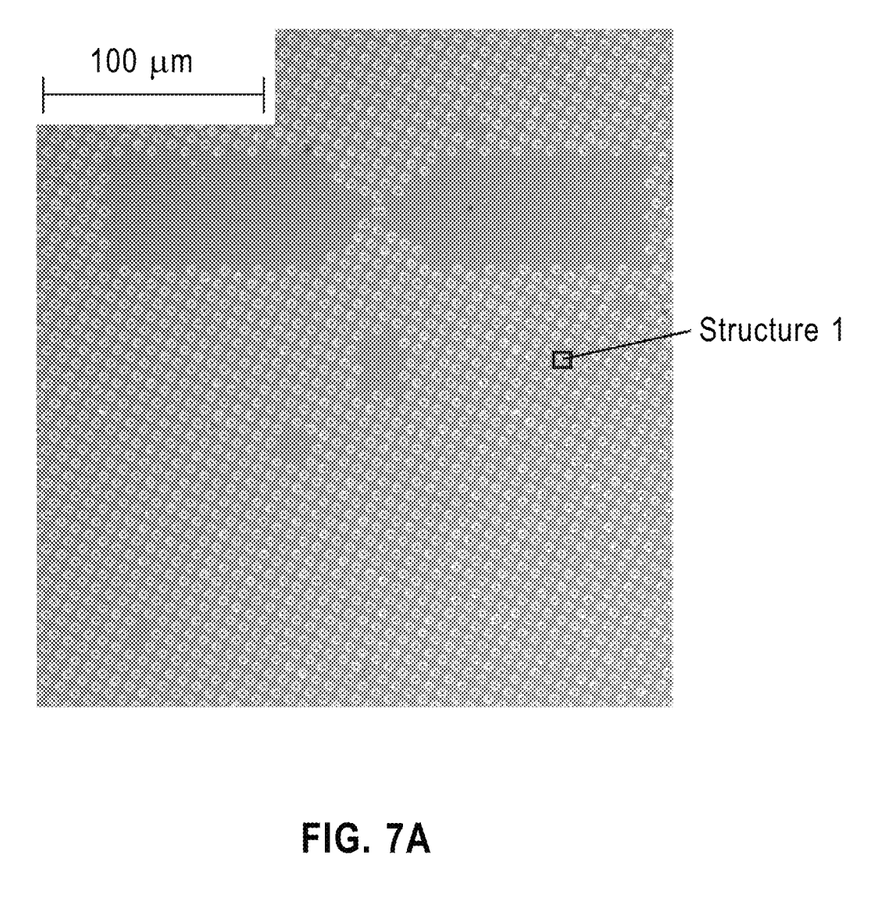
FIGS. 7A, 7B and 7C are scanning electron micrographs (SEMs) of a structure including GaN integrated on a (100) silicon substrate that is formed using the method of the present disclosure.
Figure 7B:
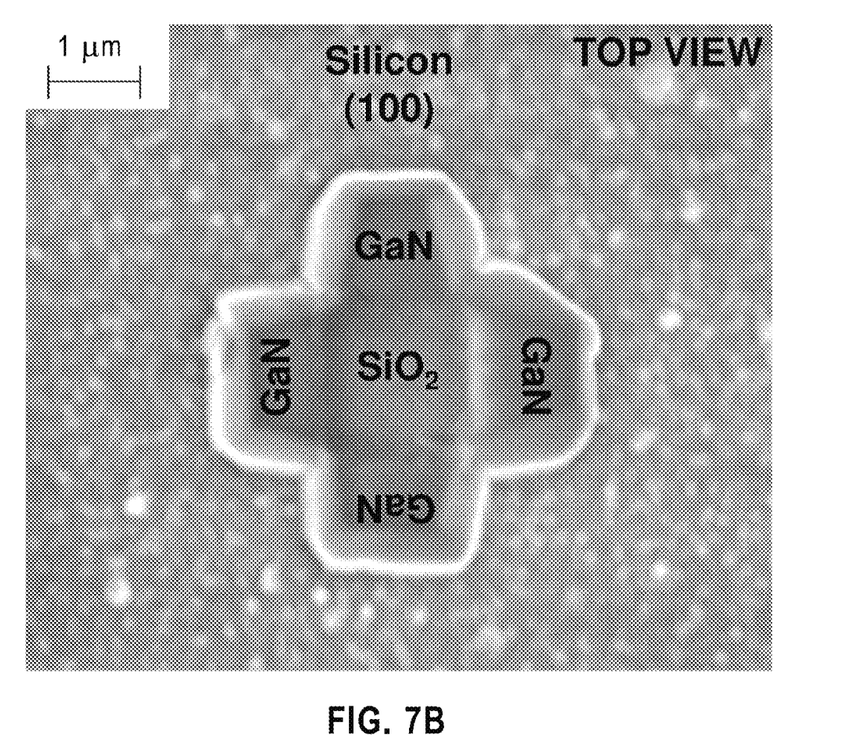
Figure 7C:
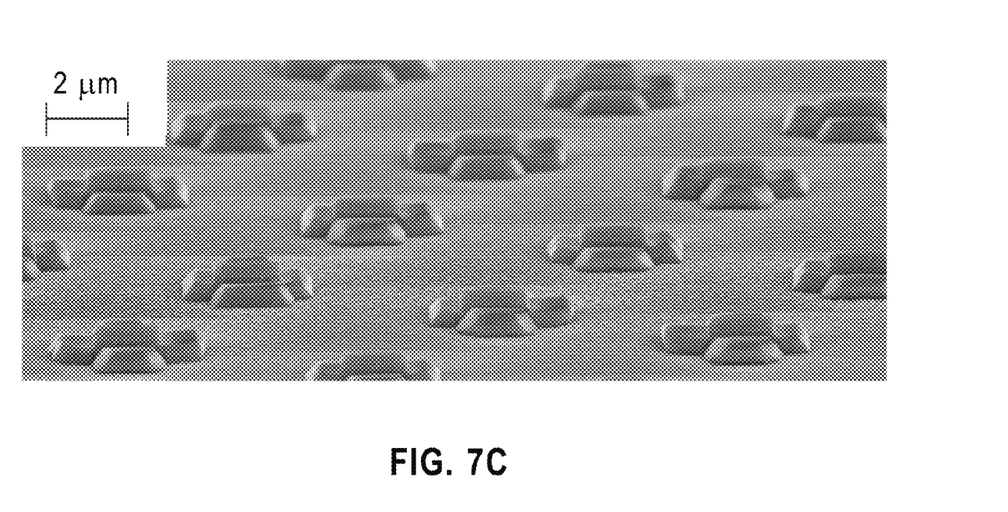

Referring now to FIGS. 7A (large area of a bulk (100) silicon substrate processed in accordance with the present disclosure), 7B (top down view of Structure 1 highlighted in FIGS. 7A) and 7C (bird's eye view at the area near Structure 1 highlighted in FIG. 7B), there are illustrated actual scanning electron micrographs (SEMs) of a structure that is formed using the method of the present disclosure. As can been seen from these SEMs, the method of the present disclosure provides selective and control growth of a gallium nitride material around the patterned dielectric material structures and square patterns can be achieved. Also, the method of the present disclosure proves a highly uniform and controlled distribution of gallium nitride material around the patterned dielectric material structures.

After forming the structure shown in FIG. 6, semiconductor devices such as, for example, field effect transistors (FET), photonic devices (i.e., light emitting diodes or laser diodes) and combinations thereof, can be formed using conventional process that are well known to those skilled in the art. In some embodiments, the semiconductor devices can be formed upon and within the gallium nitride material 20. In other embodiments, the semiconductor devices can be formed upon and within the gallium nitride material 20 and on an epitaxial semiconductor material that can be grown adjacent the gallium nitride material 20 and on an exposed uppermost surface of the original (100) silicon substrate 10. When FETs are formed upon and within the gallium nitride material 20, a portion of the gallium nitride material 20 can serve as a device channel and a gate stack including at least a gate dielectric material and gate electrode can be formed above the device channel utilizing conventional silicon complementary metal oxide semiconductor (CMOS)-like processes. In some embodiments, the FETs built atop the gallium nitride material 20 can be interconnected with existing silicon CMOS circuits to form a hybrid system. Some examples of fabricating semiconductor devices are now described. In some embodiments, a photonic device can be sandwiched between a topmost and bottommost surface of the (100) silicon substrate 10.

Figure 8:
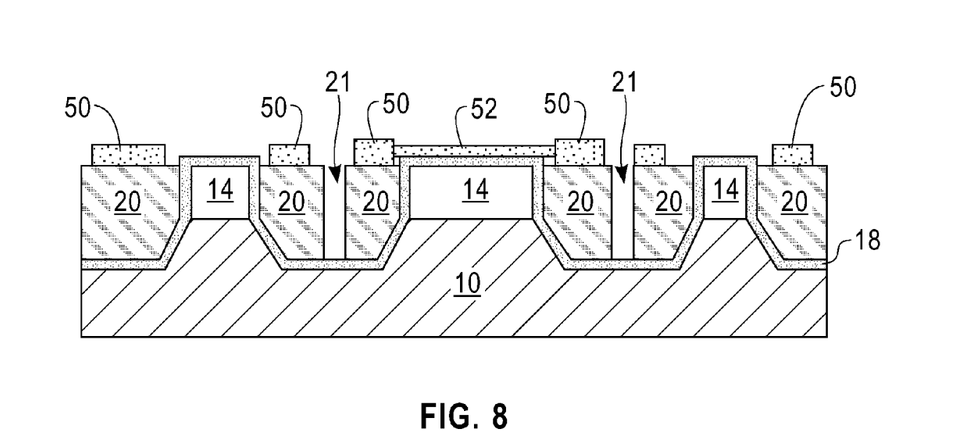
FIG. 8 is a pictorial representation (through a cross sectional view) illustrating the structure of FIG. 6 after semiconductor device fabrication.

Reference is first made to the structure shown in FIG. 8 which shows the structure of FIG. 6 after forming semiconductor devices 50 upon and within the gallium nitride material 20. In some embodiments, an interconnect 52 can be present above a patterned dielectric material structure 14 that connects one of the semiconductor devices 50 to a neighboring semiconductor device 50. In this embodiment, the semiconductor devices 50 can be FETs that are formed upon and within the gallium nitride material 20, and interconnect 52 can be a conductive material.

Figure 9:
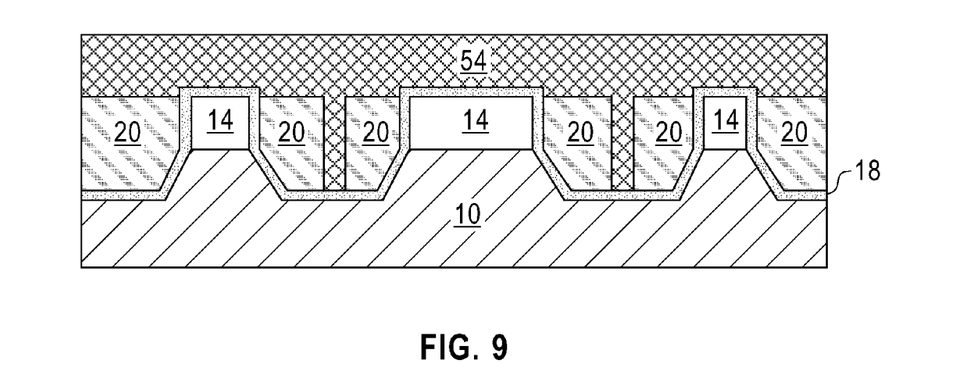
FIG. 9 is a pictorial representation (through a cross sectional view) illustrating the structure of FIG. 6 after formation of another dielectric material.
Figure 10:
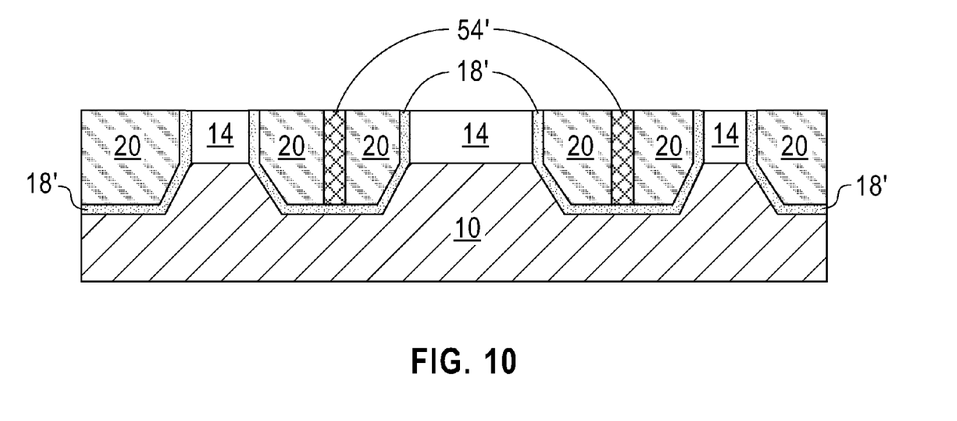
FIG. 10 is a pictorial representation (through a cross sectional view) illustrating the structure of FIG. 9 after planarization which provides a planar structure.
Figure 11:
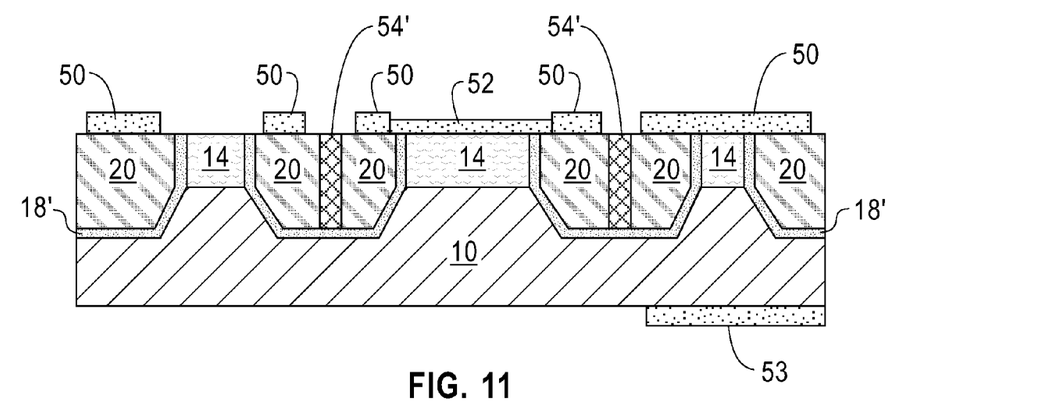
FIG. 11 is a pictorial representation (through a cross sectional view) illustrating the structure of FIG. 10 after semiconductor device fabrication.

Reference is now made to FIGS. 9-11 which illustrate another embodiment of the present disclosure in which the structure shown in FIG. 6 can be used as a template for forming semiconductor devices thereon. Specifically, FIG. 9 illustrates the structure of FIG. 6 after formation of another dielectric material 54. The another dielectric material 54 may include one of the dielectric materials mentioned above, or the another dielectric material 54 may include a planarizing dielectric material such as, for example, a photoresist, a silicate glass, or an oxide such as silicon dioxide. As shown, the another dielectric material 54 can fill the space between neighboring gallium nitride material 20 which is located on different patterned dielectric material structures 14. Also, and as shown, the another dielectric material 54 can be present atop the gallium nitride material 20 and atop a portion of the contiguous AlN buffer layer 18 that is present on uppermost surfaces of each of the patterned dielectric material structures 14.

The another dielectric material 54 can be formed by a deposition process including, but not limited to, chemical vapor deposition, plasma chemical vapor deposition, chemical solution deposition, evaporation and spin-on coating. The thickness of the another dielectric material 54 is typically from 100 nm to 10,000 nm, with a thickness from 2000 nm to 4000 nm being more typical for chemical-mechanical polishing purposes. Other thickness can be employed so long as the uppermost surface of the another dielectric material 54 is above a horizontal portion of the contiguous AlN buffer layer 18 that is present on the uppermost surface of each of the patterned dielectric material structures 14.

Referring now to FIG. 10, there is illustrated the structure of FIG. 9 after performing planarization which removes a portion of the another dielectric material 54 and the horizontal portion of the contiguous AlN buffer layer 18 that is present on uppermost surface of each of the patterned dielectric material structures 14 stopping on an uppermost surface of the gallium nitride material 20 and an uppermost surface of each patterned dielectric material structure 14. A planar structure is provided in which remaining portions of the another dielectric material 54', vertical portions of the AlN buffer layer 18', gallium nitride material 20, and each patterned dielectric material structure 14 have uppermost surfaces that are coplanar with each other. The planarization process that is used in the present disclosure may include chemical mechanical polishing and/or grinding.

Referring now to FIG. 11, there is illustrated the structure of FIG. 10 after semiconductor device fabrication. In this embodiment, semiconductor devices 50, e.g., FETs, and interconnects 52 can be formed on one side of the structure including the exposed gallium nitride material 20, photonic devices 53 such as light emitting diodes or laser diodes, and their other contacts can be formed on the opposite side of the structure and on an exposed surface of the original (100) silicon substrate.

Figure 12:
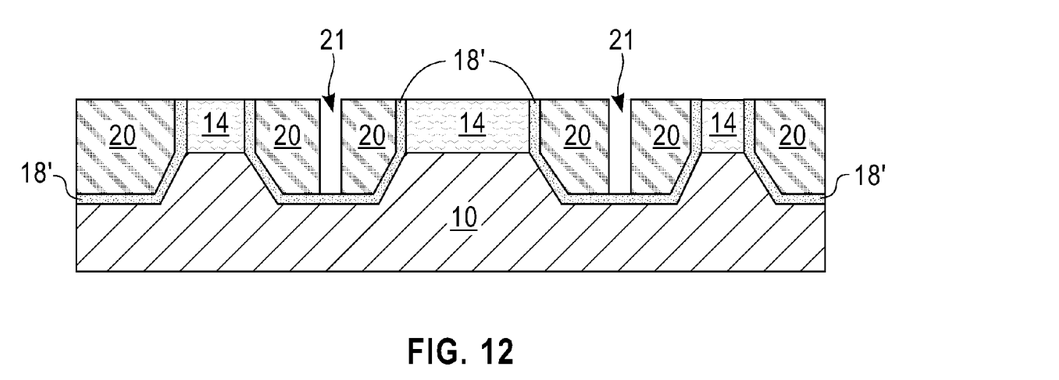
FIG. 12 is a pictorial representation (through a cross sectional view) illustrating the structure of FIG. 6 after removing an uppermost portion of the contiguous AlN buffer layer that lies atop each patterned dielectric material structure.

Reference is now made to FIGS. 12-15 which illustrate yet another embodiment of the present disclosure in which semiconductor devices can be formed using the structure shown in FIG. 6. Specifically, FIG. 12 illustrates the structure of FIG. 6 after removing an uppermost horizontal portion of the contiguous AlN buffer layer 18 that lies atop each patterned dielectric material structure 14. The removal of the uppermost horizontal portion of the contiguous AlN buffer layer 18 that lies atop each patterned dielectric material structure 14 can be performed by planarization. The remaining portion of the AlN buffer layer is labeled as 18'. As shown in the drawing, each of the patterned dielectric material structures 14 is exposed.

Figure 13:
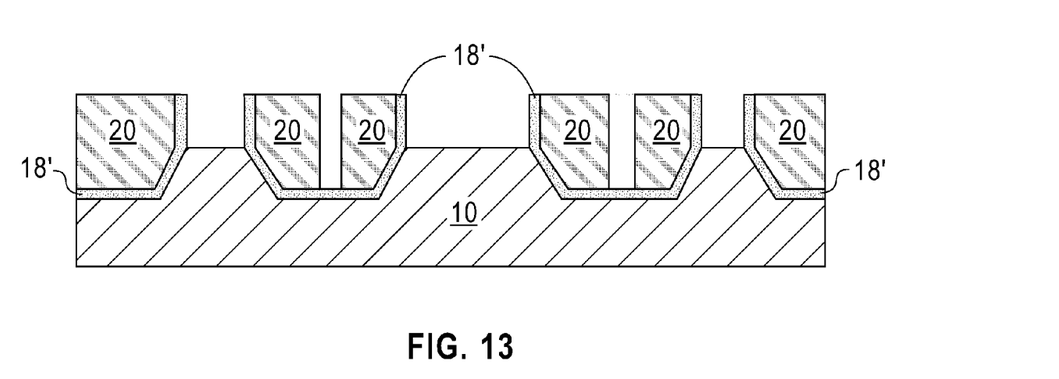
FIG. 13 is a pictorial representation (through a cross sectional view) illustrating the structure of FIG. 12 after removing each patterned dielectric material structure.

Referring now to FIG. 13, there is illustrated the structure of FIG. 12 after removing each patterned dielectric material structure 14 so as to expose a portion of the uppermost surface of the original (100) silicon substrate 10. The removal of each of the exposed patterned dielectric material structure 14 can be performed utilizing an etching process that selectively removes the dielectric material that constitutes the patterned dielectric material structures 14 from the structure. Examples of such an etching process that can be used at this point of the present disclosure include, but are not limited to, hydrofluoric acid.

Figure 14:
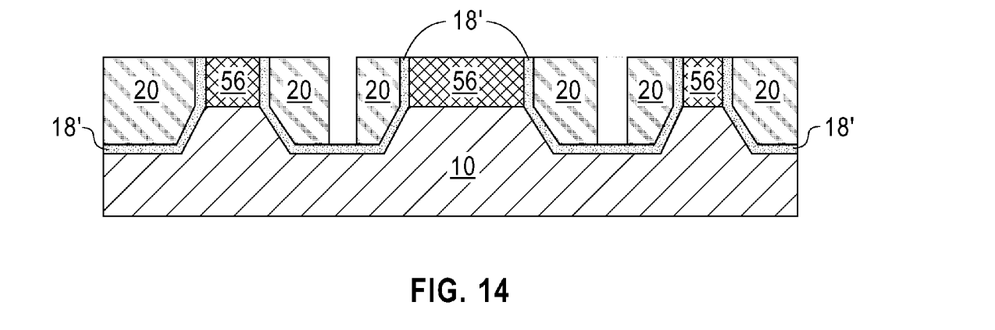
FIG. 14 is a pictorial representation (through a cross sectional view) illustrating the structure of FIG. 13 after epitaxially growth of a semiconductor material on an exposed portion of the uppermost surface of the (100) silicon substrate and planarization.

Referring now to FIG. 14, there is illustrated the structure of FIG. 13 after epitaxially growth of a semiconductor material 56 (the semiconductor material 56 may also be referred to as an epitaxial semiconductor material since it is formed utilizing an epitaxial process) on the exposed portion of the uppermost surface of the (100) silicon substrate 10 and planarization. As shown, sidewall surfaces of the semiconductor material 56 contact pillar portions of the remaining portion of the AlN buffer layer 18', and a bottommost surface of the semiconductor material 56 contacts the uppermost surface of the (100) silicon substrate 10.

Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. In the present embodiment, the semiconductor material 56 has the same crystalline characteristics as that of the physically exposed uppermost surface of the (100) silicon substrate 10. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material 56 that can be epitaxially deposited includes any semiconductor material such as, for example, silicon (Si), germanium (Ge), and silicon germanium (SiGe). In one embodiment, the semiconductor material 56 includes a same semiconductor material as that of the silicon substrate 10. In another embodiment, the semiconductor material 56 includes a different semiconductor material as that of the silicon substrate 10. It is noted that the specific material compositions for the semiconductor material 56 are provided for illustrative purposes only, and are not intended to limit the present disclosure, as any semiconductor material that may be formed using an epitaxial growth process.

A number of different sources may be used for the deposition of semiconductor material 56. In some embodiments, in which the semiconductor material 56 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which semiconductor material 56 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material 56 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial semiconductor deposition typically ranges from 550° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material 56 that is deposited can be doped or undoped. By "undoped" it is meant that the maximum dopant concentration of p-type or n-type dopants that are present in the epitaxial semiconductor material is less than $5 \times 10^{17}$ atoms/cm$^3$.

Following the epitaxial growth of semiconductor material 56, a planarization process such as chemical mechanical polishing and/or grinding can be used to provide the planar structure shown in FIG. 14.

Figure 15:
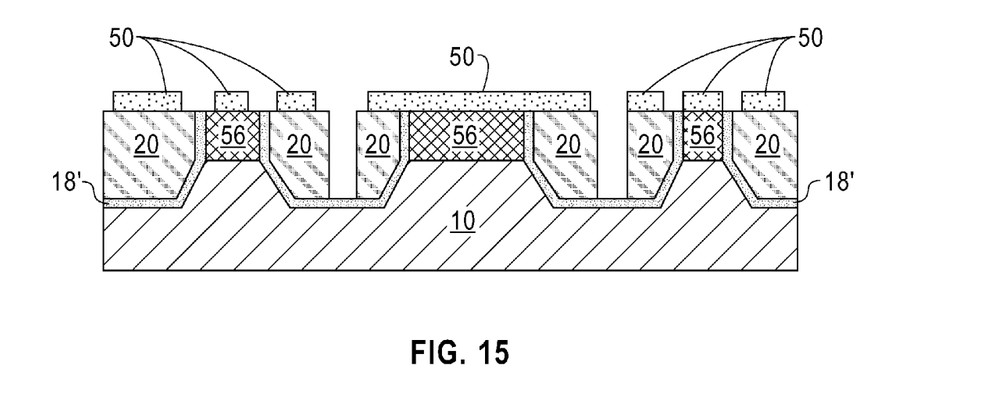
FIG. 15 is a pictorial representation (through a cross sectional view) illustrating the structure of FIG. 14 after semiconductor device fabrication.

Referring now to FIG. 15, there is illustrated the structure of FIG. 14 after semiconductor device fabrication. In this embodiment, semiconductor devices 50, e.g., FETs, are formed upon and within both the gallium nitride material 20 and the semiconductor material 56.

Figure 16:
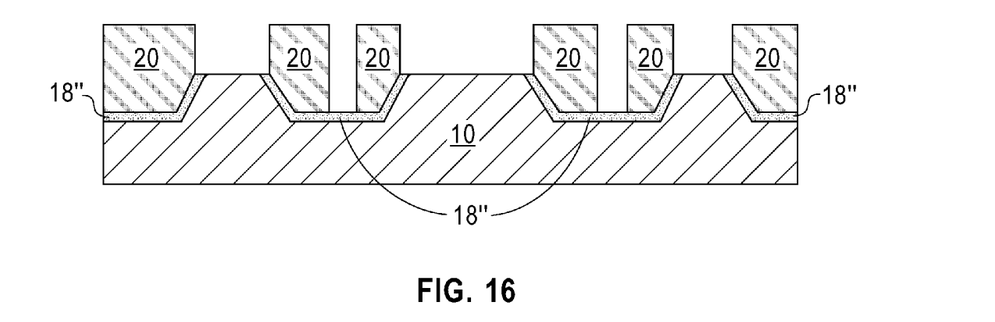
FIG. 16 is a pictorial representation (through a cross sectional view) illustrating the structure of FIG. 13 after removing sidewall portions of the remaining AlN buffer layer.
Figure 17:
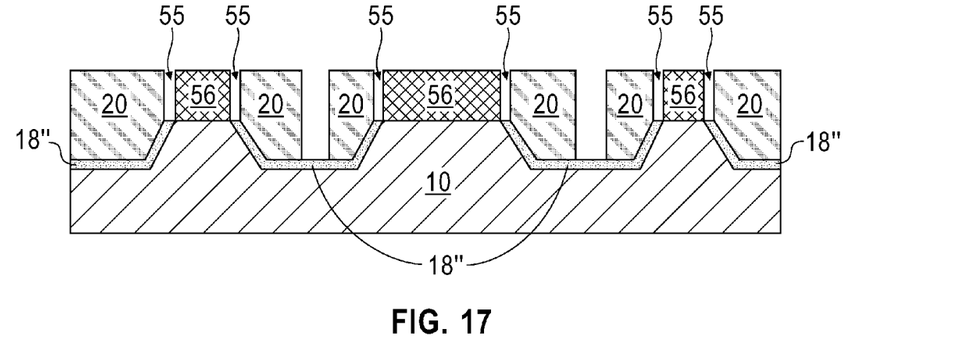
FIG. 17 is a pictorial representation (through a cross sectional view) illustrating the structure of FIG. 16 after epitaxially growth of a semiconductor material on an exposed portion of the uppermost surface of the (100) silicon substrate and planarization.
Figure 18:
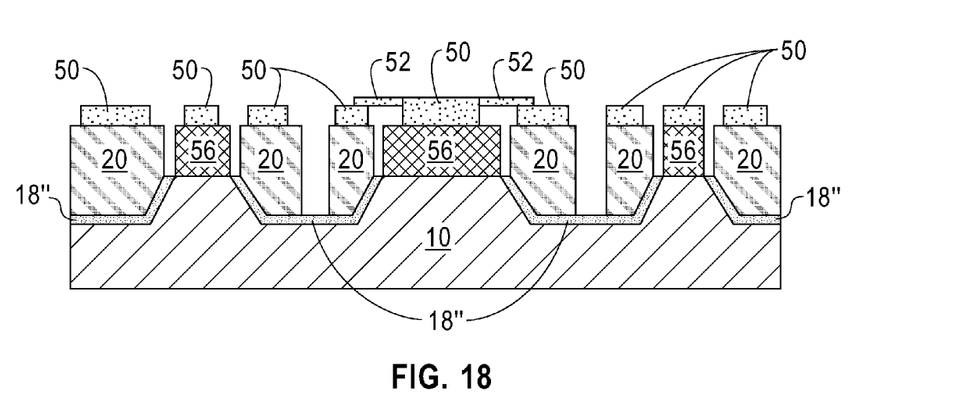
FIG. 18 is a pictorial representation (through a cross sectional view) illustrating the structure of FIG. 17 after device fabrication.

Reference is now made to FIGS. 16-18 which illustrate a further embodiment of the present disclosure which employs the structure shown in FIG. 6 as a template structure for forming semiconductor devices. Specifically, FIG. 16 illustrates the structure of FIG. 13 after removing sidewall portions, i.e., pillar portions, of the remaining AlN buffer layer so as to expose a potion of a sidewall of each gallium nitride material. The removal of the pillar portions of the remaining AlN buffer layer can be performed utilizing an etching process that selectively removes the exposed sidewall portions of the remaining AlN buffer layer. In one embodiment of the present disclosure, the etching process that can be used to selectively remove the exposed sidewall portions of the remaining AlN buffer layer comprises potassium hydroxide (KOH) or sulfuric acid (H$_2$SO$_4$). As shown, a portion of the AlN buffer layer (labeled as 18") remains within each of the openings that were formed into the (100) silicon substrate, and a topmost surface of element 18" is coplanar with an uppermost surface of the original (100) silicon substrate.

Referring now to FIG. 17, there is illustrated the structure of FIG. 16 after epitaxially growth of a semiconductor material 56 on an exposed portion of the uppermost surface of the (100) silicon substrate and planarization. The material of semiconductor material 56, epitaxial growth process, and planarization process used in this embodiment is the same as that mentioned above for forming the structure shown in FIG. 14. In this embodiment of the present disclosure a gap 55 is present between the semiconductor material 56 and the gallium nitride material 20.

Referring now to FIG. 18, there is illustrated the structure of FIG. 17 after semiconductor device fabrication. In this embodiment, semiconductor devices 50, e.g., FETs, are formed upon and within both the gallium nitride material 20 and the semiconductor material 56. An interconnect 52 can be present which can connect semiconductor devices located on the gallium nitride material to semiconductor devices located on the semiconductor material 56.

Figure 19:
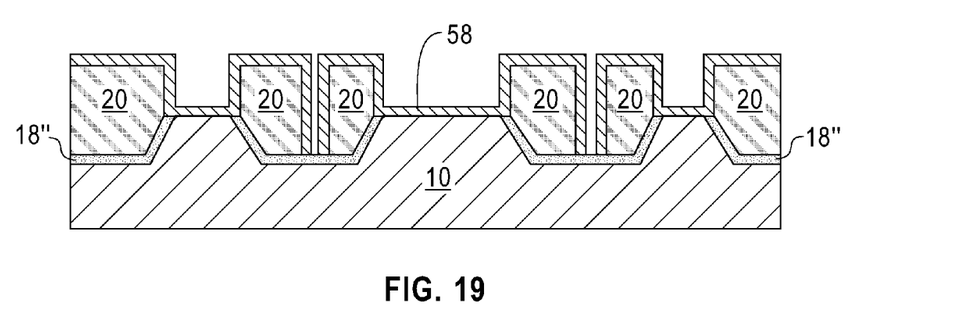
FIG. 19 is a pictorial representation (through a cross sectional view) illustrating the structure of FIG. 16 after forming a dielectric material liner.

Reference is now made to FIGS. 19-22 which illustrate a yet further embodiment of the present disclosure which employs the structure shown in FIG. 6 as a template structure for forming semiconductor devices. Specifically, FIG. 19 illustrates the structure of FIG. 16 after forming a dielectric material liner 58. The dielectric material liner 58 may comprise a dielectric oxide, dielectric nitride, and/or dielectric oxynitride. In one embodiment of the present disclosure, the dielectric material liner 58 comprises silicon dioxide or silicon nitride. The dielectric material liner 58 can be formed utilizing a conformal deposition process such as, for example, chemical vapor deposition, plasma enhanced chemical vapor deposition or atomic layer deposition. By "conformal" it is meant that the deposition provides a film that defines a morphologically uneven interface with another body and has a thickness that is substantially the same (i.e., ±10 Angstroms) everywhere along the interface. The thickness of the dielectric material liner 58 can be from 2 nm to 5 nm, although lesser and greater thicknesses can also be employed.

Figure 20:
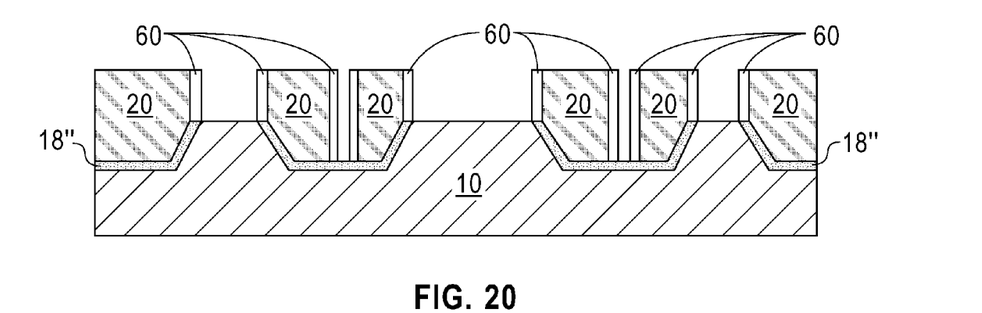
FIG. 20 is a pictorial representation (through a cross sectional view) illustrating the structure of FIG. 19 after removing portions of the dielectric material liner and forming dielectric spacers.

Referring now to FIG. 20, there is illustrated the structure of FIG. 19 after removing portions of the dielectric material liner 58 and forming dielectric spacers 60. The removal of portions of the dielectric material liner 58 can be performed utilizing an etching process such as, for example, reactive ion etching (RIE). As shown, the portions of the dielectric material liner 58 that are removed are located on horizontal surfaces of the structure shown in FIG. 19.

Figure 21:
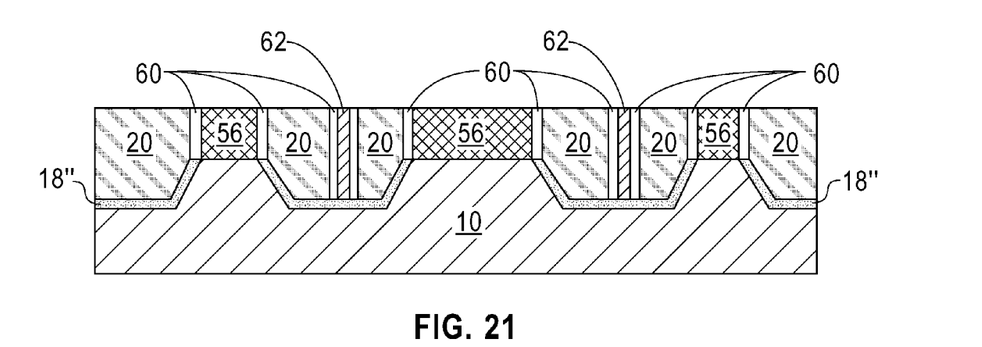
FIG. 21 is a pictorial representation (through a cross sectional view) illustrating the structure of FIG. 20 after epitaxially growth of a semiconductor material on an exposed portion of the uppermost surface of the (100) silicon substrate and planarization.

Referring now FIG. 21, there is illustrated the structure of FIG. 20 after epitaxially growth of a semiconductor material 56 on an exposed portion of the uppermost surface of the (100) silicon substrate and planarization. The material of semiconductor material 56, epitaxial growth process, and planarization process used in this embodiment is the same as that mentioned above for forming the structure shown in FIG. 14. It is noted that during the epitaxial grown of the semiconductor material 56, polycrystalline semiconductor material 62 forms in the space that is present between different portions of gallium nitride material 20.

Figure 22:
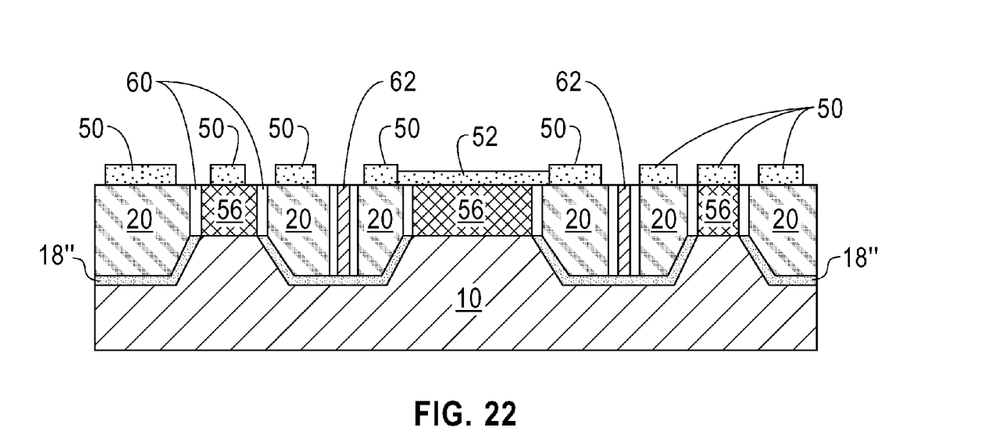
FIG. 22 is a pictorial representation (through a cross sectional view) illustrating the structure of FIG. 21 after semiconductor device fabrication.

FIG. 22 is a pictorial representation (through a cross sectional view) illustrating the structure of FIG. 21 after semiconductor device fabrication. In this embodiment, semiconductor devices 50, e.g., FETs, are formed upon and within both the gallium nitride material 20 and the semiconductor material 56. An interconnect 52 can be present which can connect semiconductor devices located on the gallium nitride material to semiconductor devices located on the semiconductor material 56.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a (100) silicon substrate having a plurality of patterned dielectric material structures located on an uppermost surface of the silicon substrate and a plurality of openings located within the silicon substrate and beneath the plurality of patterned dielectric material structures, wherein each opening exposes sidewall surfaces of the silicon substrate having a (111) crystal plane and a planar sub-surface of said silicon substrate having a (100) crystal plane;
an AlN buffer layer continuously present on sidewalls of each patterned dielectric material structure and on an entirety of each of said sidewall surfaces and said planar sub-surface of said silicon substrate within each of said openings;

a gallium nitride material located in each of said openings and entirely separated from said silicon substrate by said AlN buffer layer, wherein a topmost surface of said gallium nitride material is coplanar with a topmost surface of each of said patterned dielectric material structures.

2. The semiconductor structure of claim 1, wherein said (100) silicon substrate comprises a bulk semiconductor material.

3. The semiconductor structure of claim 1, wherein said (100) silicon substrate comprises a topmost layer of a silicon-on-insulator substrate.

4. The semiconductor structure of claim 1, wherein each patterned dielectric material structure has four sidewalls.

5. The semiconductor structure of claim 1, wherein said gallium nitride material is selected from GaN, GaAlN, GaInN and GaAlInN.

6. The semiconductor structure of claim 1, wherein said gallium nitride material is single crystal and is of a single phase, wherein said single phase is a wurtzite phase.

7. The semiconductor structure of claim 1, wherein each opening of said plurality of openings has an upper portion having a width that is larger than a width of a lower portion.

8. The semiconductor structure of claim 1, wherein a space is present in said opening and between gallium nitride material located on different patterned dielectric material structures.

9. The semiconductor structure of claim 1, wherein said gallium nitride material located adjoining corners of each patterned dielectric material structure has a first thickness and said gallium nitride material located adjoining sidewalls of each patterned dielectric material structure has a second thickness, wherein said second thickness is greater than said first thickness.

10. The semiconductor structure of claim 1, wherein said gallium nitride material consists essentially of GaN.

11. The semiconductor of claim 1, wherein a portion of said AlN buffer layer is present on an uppermost surface of each of said patterned dielectric material structures.

12. The semiconductor structure of claim 1, further comprising at least one semiconductor device located upon and within said gallium nitride material.

13. The semiconductor structure of claim 12, further comprising a photonic device sandwiched between a topmost and bottommost surface of said (100) silicon substrate.

14. The semiconductor structure of claim 11, further comprising at least one semiconductor device located upon and within said gallium nitride material.

* * * * *